United States Patent [19]
Suzu

[11] Patent Number: 5,854,772
[45] Date of Patent: Dec. 29, 1998

US005854772A

[54] DECODER CIRCUIT WITH LESS TRANSISTOR ELEMENTS

[75] Inventor: Takayuki Suzu, Tokyo, Japan

[73] Assignee: NEC Corporation, Tokyo, Japan

[21] Appl. No.: 925,738

[22] Filed: Sep. 9, 1997

[30] Foreign Application Priority Data

Sep. 13, 1996 [JP] Japan ................................. 8-243926

[51] Int. Cl.⁶ .................................................. G11C 8/00

[52] U.S. Cl. ............................... 365/230.06; 365/230.03

[58] Field of Search ........................ 365/230.06, 230.03, 365/230.08

[56] References Cited

U.S. PATENT DOCUMENTS 4,972,380  11/1990  Hidaka et al. ..................... 365/230.06

*Primary Examiner*—David Nelms
*Assistant Examiner*—David Lam
*Attorney, Agent, or Firm*—Foley & Lardner

[57] ABSTRACT

Eight decoder circuits each of which comprising two transfer-gate-circuit transistors and two transistors for fixation of unselected level are connected in series and arranged in three hierarchies. Consequently, the decoder circuit is capable of selecting one output signal wire out of eight output signal wires by three address input signals so as to output an output of a high level to the selected output signal wire.

12 Claims, 13 Drawing Sheets

F I G. 13

| NO. OF ADDRESS WIRES | NO. OF TRANSISTOR ELEMENTS OF CONVENTIONAL DECODER CIRCUIT | NO. OF TRANSISTOR ELEMENTS OF DECODER CIRCUIT OF THE PRESENT INVENTION | NO. OF REDUCED TRANSISTORS |
|---|---|---|---|
| 2 | 24 | 12 | 12(50%) |
| 3 | 64 | 28 | 36(44%) |
| 4 | 160 | 60 | 100(38%) |
| 5 | 384 | 124 | 260(33%) |
| 6 | 896 | 252 | 644(29%) |

DECODER CIRCUIT WITH LESS TRANSISTOR ELEMENTS

BACKGROUND OF THE INVENTION

The present invention relates to a decoder circuit, especially to that used in the semi-conductor memory device.

Description of the Related Art

Conventionally, the semi-conductor memory device has a decoder circuit for selecting a large number of memory cells with a small number of address inputs.

Now, a conventional decoder circuit will be described with reference to FIG. 1. FIG. 1 is a circuit diagram of the conventional decoder circuit. This particular decoder circuit is used in case of selecting one output signal wire out of eight output signal wires by making use of three address input signal wires. This decoder circuit of the conventional type comprises eight 3NAND circuits NANDA1 to NANDA8 and eight inverter circuits INVA1 to INVA8 of which input signal wires are at the same time output signal wires of the 3NAND circuits.

Next, detailed circuit configurations and operations of the 3NAND circuits and the inverter circuits are to be described with reference to one of the 3NAND circuits NANDA1 and one of the inverter circuits INVA1.

3NAND circuit NANDA1 is composed of total of six transistors, n-channel enhancement transistors QA04 to QA06 and p-channel enhancement transistors QA01 to QA03. Each of the p-channel enhancement transistors QA01 to QA03 has its source terminal connected to a power source, and its drain terminal connected to the output signal wire of the 3NAND circuit NANDA1 in common with the drain sources of the other two p-channel enhancement transistors. The state of connections of the n-channel enhancement transistors QA04 to QA06 are as follows: the n-channel enhancement transistor QA04 has its drain terminal connected to the output signal wire of the 3NAND circuit NANDA1, the source terminal of the n-channel enhancement transistor QA04 is connected to the drain terminal of the n-channel enhancement transistor QA05, the source terminal of the n-channel enhancement transistor QA05 is connected to the drain terminal of the n-channel enhancement transistor QA06, and the source terminal of the n-channel enhancement transistor QA06 is grounded.

A first input signal wire which transmits a first input signal A0' is commonly linked to the gate terminals of the p-channel enhancement transistor QA01 and the n-channel enhancement transistor QA06. A second input signal wire which transmits a second input signal A1' is commonly connected to the gate terminals of the p-channel enhancement transistor QA02 and the n-channel enhancement transistor QA05. A third input signal wire which transmits a third input signal A2' is commonly connected to the gate terminals of the p-channel enhancement transistor QA03 and the n-channel enhancement transistor QA04.

The inverter circuit INVA1 is composed of a total of two transistors, an n-channel enhancement transistor QA08 and a p-channel enhancement transistor QA07. The p-channel enhancement transistor QA07 has its source terminal connected to the power source and its drain terminal connected to the drain terminal of the n-channel enhancement transistor QA08. The output signal wire of the inverter circuit INVA1 is commonly connected to the drain terminals of the p-channel enhancement transistor QA07 and the n-channel enhancement transistor QA08. The source terminal of the n-channel enhancement transistor QA08 is grounded. The input signal wire of the inverter circuit INVA1 is linked with the output signal wire of the 3NAND circuit NANDA1. The input signal wire of the inverter circuit INVA1 is commonly connected to the gate terminals of the p-channel enhancement transistor QA07 and the n-channel enhancement transistor QA08.

The following is a description of the operation of the 3NAND circuit NANDA1 and the inverter circuit INVA1. When the first to third input signals are all of high level (hereafter referred as level H), the 3NAND circuit NANDA1 is to have all the p-channel enhancement transistors QA01 to QA03 cut off (also referred as non-conductive), and all the n-channel enhancement transistors QA04 to QA06 turned on (also referred as conductive), in order to bring the output signal of the NAND circuit NANDA1 to a low level (hereafter referred as level L). Moreover, in case when the first input signal A0' is of level L, the n-channel enhancement transistor QA06 is to be cut off and the p-channel enhancement transistor QA01 is to be turned on so as to bring the output signal of the NAND circuit NANDA1 to level H. Likewise, when either one of the second input signal A1' and the third input signal A2' is of level L, the output signal of the NAND circuit NANDA1 is to become level H through the same circuit operation under the state in which the first input signal A is of level L.

Next, in case when the input signal of the inverter circuit INVA1 is of level L, the n-channel enhancement transistor QA08 is to be cut off and the p-channel enhancement transistor QA07 is to be turned on which brings an output signal OUTA0 of the inverter circuit INVA1 to level H. Furthermore, when the input signal of the inverter circuit INVA1 is of level H, the n-channel enhancement transistor QA08 is turned on and the p-channel enhancement transistor QA07 is cut off which brings the output signal OUTA0 of the inverter circuit INVA1 to level L. Therefore, when all among the first to third input signals of the NAND circuit NANDA1 are of level H, the output signal OUTA0 of the inverter circuit INVA1 is to become level H. In cases except when all among the first to third input signals of the NAND circuit NANDA1 are of level H, the output signal OUTA0 of the inverter circuit INVA1 is to become of level L.

It has been described above the circuit configuration and the operation of the NAND circuit NANDA1 and the inverter circuit INVA1. Likewise, the NAND circuits NANDA2 to NANDA8 and the inverter circuits INVA2 to INVA8 shown in FIG. 1 have the same circuit configurations and operations as those of the NAND circuit NANDA1 and the inverter circuit INVA1.

According to the above descriptions, the decoder circuit shown in FIG. 1 is capable of selecting one output signal wire out of eight output signal wires by employing three address input signal wires.

As to the conventional decoder circuit composed of a combination of the NAND circuits and the inverter circuits, a total of N transistor elements as expressed in the following formula become necessary.

$$N = \{2 \times (\text{No. of address wires} + 1)\} \times 2^{(\text{No. of address wires})} \quad (1)$$

Accordingly, the number of required transistor elements of the conventional decoder circuit shown in FIG. 1 which selects one output signal wire out of eight output signal wires with the use of three address input signal wires can be given by applying formula (1). The calculation for the necessary number of transistor elements of this particular conventional decoder circuit is as follows:

$$\{2 \times (3+1)\} \times 2^3 = 64 \quad (2)$$

Thus, as for the decoder circuit shown in FIG. 1, there is required 64 transistors. Furthermore, as to another example, in case of a decoder circuit which selects one output signal wire out of 16 output signal wires with the use of four address input signal wires, as many as 160 transistors become necessary. Therefore, as to the conventional decoder circuit composed of a combination of the NAND circuits and the inverter circuits, the number of constituent transistors of the decoder circuit becomes larger which leads to a problem that the portion occupied by the decoder circuit within the semi-conductor memory device becomes greater.

SUMMARY OF THE INVENTION

Therefore, the present invention has been achieved with such points in mind and with an object of providing a decoder circuit capable of reducing the number of transistor elements constituting the decoder circuit so as to minimize the portion occupied by the decoder circuit within the semiconductor memory device.

In accordance with the first aspect of the present invention, there is provided a decoder circuit for decoding signals comprising: an input signal wire for transmitting an input signal; a first output signal wire for transmitting a first output signal; a second output signal wire for transmitting a second output signal; a first address signal wire for transmitting a first TRUE address input signal; a second address signal wire for transmitting a second BAR address input signal which is the antiphase of the first TRUE address signal; a first n-MOS transistor having its source terminal connected to the input signal wire, its gate terminal connected to the first address signal wire and its drain terminal connected to the first output signal wire; a second n-MOS transistor having its source terminal connected to a power source on the ground level, its gate terminal connected to the second address signal wire and its drain terminal connected to the first output signal wire; a third n-MOS transistor having its source terminal connected to the input signal wire, its gate terminal connected to the second address signal wire and its drain terminal connected to the second output signal wire; and a fourth n-MOS transistor having its source terminal connected to a power source on the ground level, its gate terminal connected to the first address signal wire and its drain terminal connected to the second output signal wire.

According to the second aspect of the present invention, the decoder circuit of the first aspect of the present invention is characterized in that the first and the third n-MOS transistors are transfer-gate-circuit transistors, and that the second and the fourth n-MOS transistors are level-pull-down transistors.

With regard to the third aspect of the present invention, there is provided a decoder circuit for decoding signals comprising: an input signal wire for transmitting an input signal; a first output signal wire for transmitting a first output signal; a second output signal wire for transmitting a second output signal; a first address signal wire for transmitting a first TRUE address input signal; a second address signal wire for transmitting a second BAR address input signal which is the antiphase of the first TRUE address signal; a first n-MOS transistor having its source terminal connected to the input signal wire, its gate terminal connected to the first address signal wire and its drain terminal connected to the first output signal wire; a first p-MOS transistor having its source terminal connected to a power source, its gate terminal connected to the first address signal wire and its drain terminal connected to the first output signal wire; a third n-MOS transistor having its source terminal connected to the input signal wire, its gate terminal connected to the second address signal wire and its drain terminal connected to the second output signal wire; and a second p-MOS transistor having its source terminal connected to a power source, its gate terminal connected to the second address signal wire and its drain terminal connected to the second output signal wire.

Regarding the fourth aspect of the present invention, the decoder circuit according to the third aspect of the present invention is characterized in that the first and the third n-MOS transistors are transfer-gate-circuit transistors, and that the first and the second p-MOS transistors are level-up transistors.

As to the fifth aspect of the present invention, there is provided a decoder circuit for decoding signals comprising: an input signal wire for transmitting an input signal; a first output signal wire for transmitting a first output signal; a second output signal wire for transmitting a second output signal; a first address signal wire for transmitting a first TRUE address input signal; a second address signal wire for transmitting a second BAR address input signal which is the antiphase of the first TRUE address signal; a third p-MOS transistor having its source terminal connected to the input signal wire, its gate terminal connected to the first address signal wire and its drain terminal connected to the first output signal wire; a second n-MOS transistor having its source terminal connected to a power source on the ground level, its gate terminal connected to the first address signal wire and its drain terminal connected to the first output signal wire; a fourth p-MOS transistor having its source terminal connected to the input signal wire, its gate terminal connected to the second address signal wire and its drain terminal connected to the second output signal wire; and a fourth n-MOS transistor having its source terminal connected to a power source on the ground level, its gate terminal connected to the second address signal wire and its drain terminal connected to the second output signal wire.

Concerning the sixth aspect of the present invention, the decoder circuit according to the fifth aspect of the present invention is characterized in that the third and the fourth p-MOS transistors are transfer-gate-circuit transistors, and that the second and the fourth n-MOS transistors are level-pull-down transistors.

In accordance with the seventh aspect of the present invention, there is provided a decoder circuit for decoding signals comprising: an input signal wire for transmitting an input signal; a first output signal wire for transmitting a first output signal; a second output signal wire for transmitting a second output signal; a first address signal wire for transmitting a first TRUE address input signal; a second address signal wire for transmitting a second BAR address input signal which is the antiphase of the first TRUE address signal; a third p-MOS transistor having its source terminal connected to the input signal wire, its gate terminal connected to the first address signal wire and its drain terminal connected to the first output signal wire; a fourth p-MOS transistor having its source terminal connected to the input signal wire, its gate terminal connected to the second address signal wire and its drain terminal connected to the second output signal wire; a fifth p-MOS transistor having its source terminal connected to a power source, its gate terminal connected to the second address signal wire and its drain terminal connected to the first output signal wire; and a sixth p-MOS transistor having its source terminal connected to the power source, its gate terminal connected to the first address signal wire and its drain terminal connected to the second output signal wire.

In regard to the eighth aspect of the present invention, the decoder circuit according to the seventh aspect of the present invention is characterized in that the third and the fourth p-MOS transistors are transfer-gate-circuit transistors, and that the fifth and the sixth p-MOS transistors are level-up transistors.

As to the ninth aspect of the present invention, there is provided a decoder circuit for decoding signals comprising hierarchically constructed decoder circuit assemblies each of which including a plurality of decoder circuits corresponding to one of the eight types of decoder circuit according to the first to the eighth aspects of the present invention among which the first address input wire and the second input address wire are shared. Each input signal wire of a decoder circuit assembly of number n, where n is a natural number equal to or over two, is connected without overlapping to either the first or the second output signal wire of a decoder circuit assembly of number n−1.

With regard to the tenth aspect of the present invention, there is provided a decoder circuit according to the ninth aspect of the present invention wherein the decoder circuit assembly of number n includes a total of $2^{n-1}$ decoder circuits corresponding to one of the decoder circuits indicated in the first to the eighth aspects of the present invention, and a total of $2^{n-1}$ input signal wires of the decoder circuit assembly of number n are connected without overlapping to a total of $2^{n-1}$ the first or the second output signal wires.

In accordance with the eleventh aspect of the present invention, there is provided a decoder circuit according to either the ninth or the tenth aspect of the present invention wherein each of the output signal wires of the decoder circuit assembly belonging to the last hierarchy is connected to a certain number of inverters in series.

The decoder circuit according to the present invention is composed of transfer-gate-circuit transistors and transistors for fixation of unselected level. Therefore, in case of constructing a decoder by connecting the above decoder circuits in series arranged in a total of n hierarchies so as to have one output signal wire selected from a total of $2^{n-1}$ output signal wires, there is no need for each decoder circuit to generate a current or a voltage of a selected level but it is only required that the current or the voltage of the selected level is to be transmitted to the output of the decoder circuit through each transfer-gate-circuit transistor. Furthermore, since it is ensured that the unselected level is fixed at each decoder circuit, there should be no false selection of output signal wire.

The above and further objects and the novel feature of the invention will more fully appear from the following detailed description when the same is read in connection with the accompanying drawings. It is to be expressly understood, however, that the drawings are for illustration only and are not intended as a definition of the limits of the invention.

BRIEF DESCRIPTION OF THE DRAWINGS

FIG. 13 is a chart comparing the conventional decoder circuit with the decoder circuit of the present invention in terms of numbers of adopted transistor elements.

DESCRIPTION OF THE PREFERRED EMBODIMENTS

Figure 1:
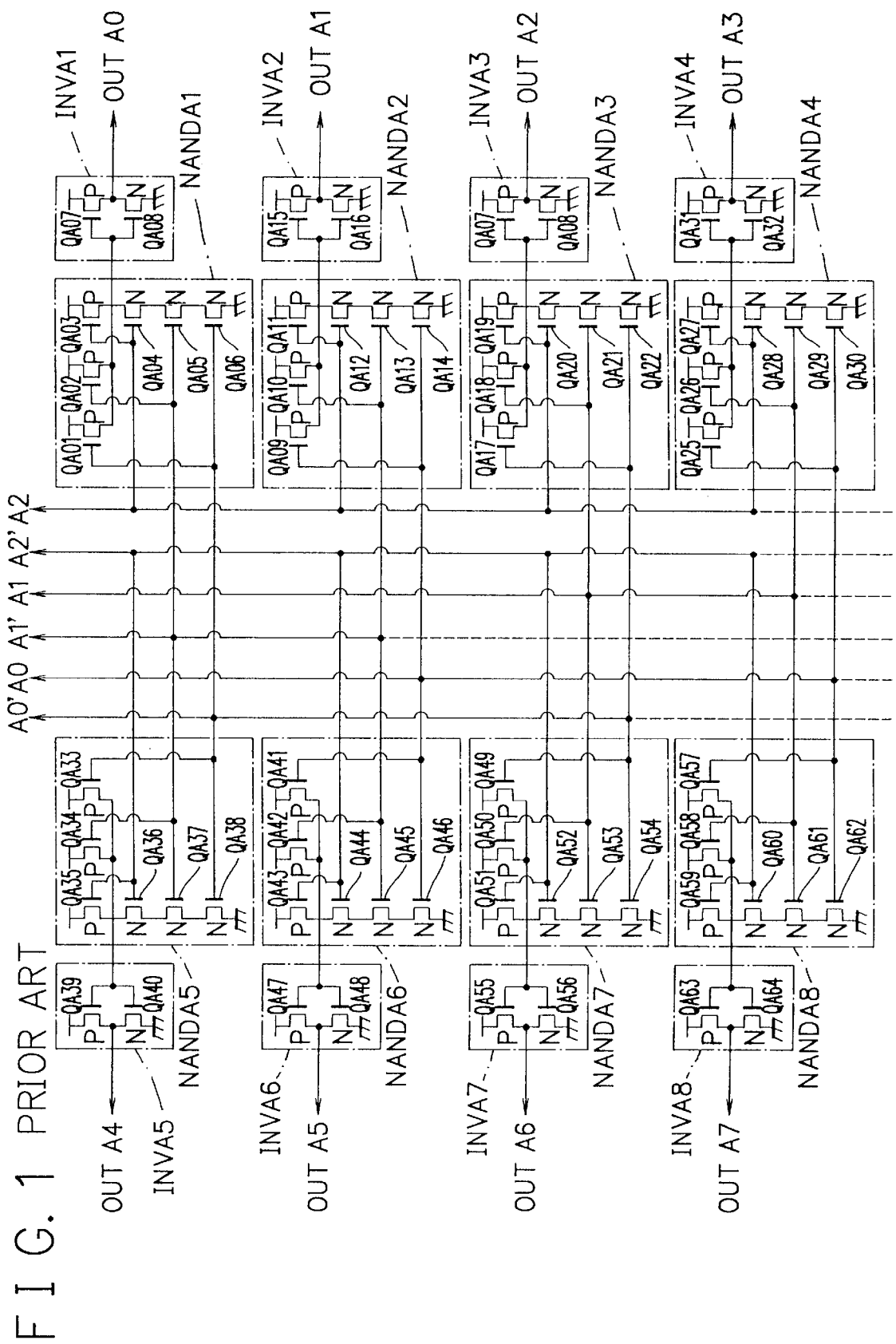
FIG. 1 is a circuit diagram showing a conventional decoder circuit.

Referring now to the drawings, the decoder circuit of the present invention will become apparent from the following description of the preferred embodiments of the invention.

Figure 2:
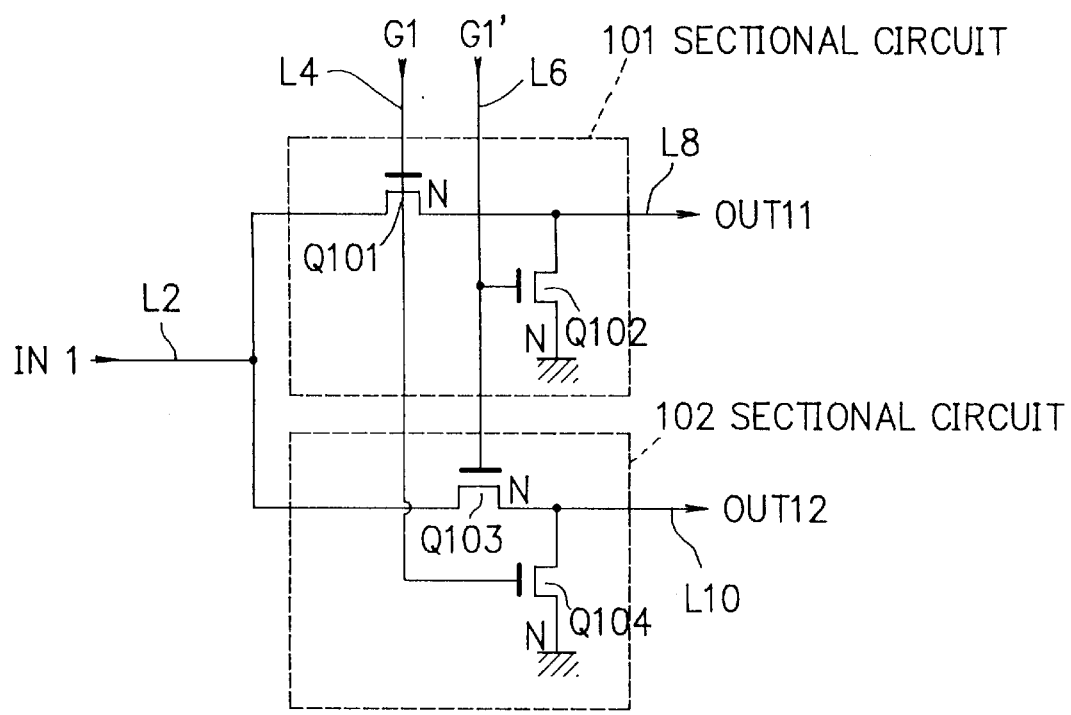
FIG. 2 is a circuit diagram showing a decoder circuit of a first embodiment of the present invention.

A description of a first embodiment of the present invention will now be given with reference to FIG. 2. FIG. 2 indicates a circuit diagram of a decoder circuit according to the first embodiment. This specific decoder circuit comprises two sectional circuits 101 and 102 which are sharing an input signal wire L2 as a common input wire. The input signal wire L2 transmits an input signal IN1. The sectional circuit 101 is composed of two n-MOS transistors; a transfer-gate-circuit transistor Q101 and a level-pull-down transistor Q102. The sectional circuit 102 is composed of two n-MOS transistors; a transfer-gate-circuit transistor Q103 and a level-pull-down transistor Q104.

The transfer-gate-circuit transistor Q101 has its source terminal connected to the input signal wire L2, its gate terminal connected to a TRUE address input signal wire L4 and its drain terminal connected to an output signal wire L8. The level-pull-down transistor Q102 has its source terminal grounded, its gate terminal connected to a BAR address input signal wire L6 and its drain terminal connected to the output signal wire L8. The transfer-gate-circuit transistor Q103 has its source terminal connected to the input signal wire L2, its gate terminal connected to the BAR address input signal wire L6 and its drain terminal connected to an output signal wire L10. The level-pull-down transistor Q104 has its source terminal grounded, its gate terminal connected to the TRUE address input signal wire L4 and its drain terminal connected to the output signal wire L10. Here, a TRUE address input signal G1 and a BAR address input signal G1' has an antiphase relationship.

Provided that the input signal IN1 is of level L, the TRUE address input signal G1 is of level L, and that the BAR address input signal G1' is of level H, the transfer-gate-circuit transistor Q101 and the level-pull-down transistor Q104 become non-conductive, and the level-pull-down transistor Q102 and the transfer-gate-circuit transistor Q103 become conductive. Consequently, the output signal OUT11 and the output signal OUT12 are to become of level L.

Moreover, under the condition that the input signal IN1 is of level L, the TRUE address input signal G1 is of level H and that BAR address input signal G1' is of level L, the transfer-gate-circuit transistor Q101 and the level-pull-down transistor Q104 become conductive, and the level-pull-down transistor Q102 and the transfer-gate-circuit transistor Q103 become non-conductive. Accordingly, both the output signal OUT11 and the output signal OUT12 become of level L.

Furthermore, when being provided that both the input signal IN1 and the TRUE address input signal G1 are of level H, and that the BAR address input signal G1' is of level L, the transfer-gate-circuit transistor Q101 and the level-pull-down transistor Q104 become conductive, and the level-pull-down transistor Q102 and the transfer-gate-circuit transistor Q103 become non-conductive. Thus, the output signal OUT11 becomes of level H and the output signal OUT12 becomes of level L.

In addition, when the input signal IN1 is of level H, the TRUE address input signal G1 is of level L and that BAR address input signal G1' is of level H, the transfer-gate-circuit transistor Q101 and the level-pull-down transistor Q104 become non-conductive, and the level-pull-down transistor Q102 and the transfer-gate-circuit transistor Q103 become conductive. Consequently, the output signal OUT11 becomes of level L and the output signal OUT12 becomes of level H.

Therefore, in case when the input signal IN1 is of level L, both the output signal OUT11 and the output signal OUT12 become of level L without depending on the levels of the TRUE address input signal G1 and the BAR address input signal G1'.

As it has been described above, when a signal of level H, i.e., a selected level, is being inputted as an input signal, the decoder circuit is to switch the levels H and L of the TRUE address input signal G1 and the BAR address input signal G1' so as to output without failing an output of level H to either the output signal wire L8 or L10 which has been selected, and to output an output of level L to the unselected output wire.

Figure 3:
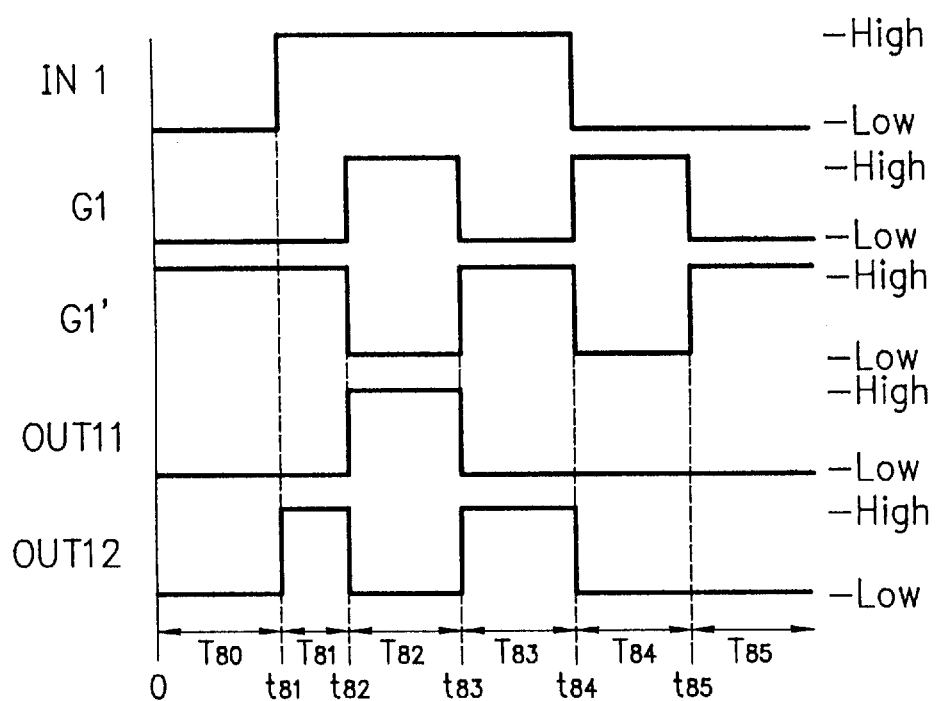
FIG. 3 is a diagram showing waveforms of the operation of the decoder circuit shown in FIG. 2.

FIG. 3 shows waveforms indicating the operation of the above-mentioned decoder circuit. The vertical axis indicates the relationship of the input signal IN1, the TRUE address input signal G1, the BAR address input signal G1', the output signal OUT11 and the output signal OUT12 in terms of levels H and L. The horizontal axis indicates the time sequence.

Figure 4:
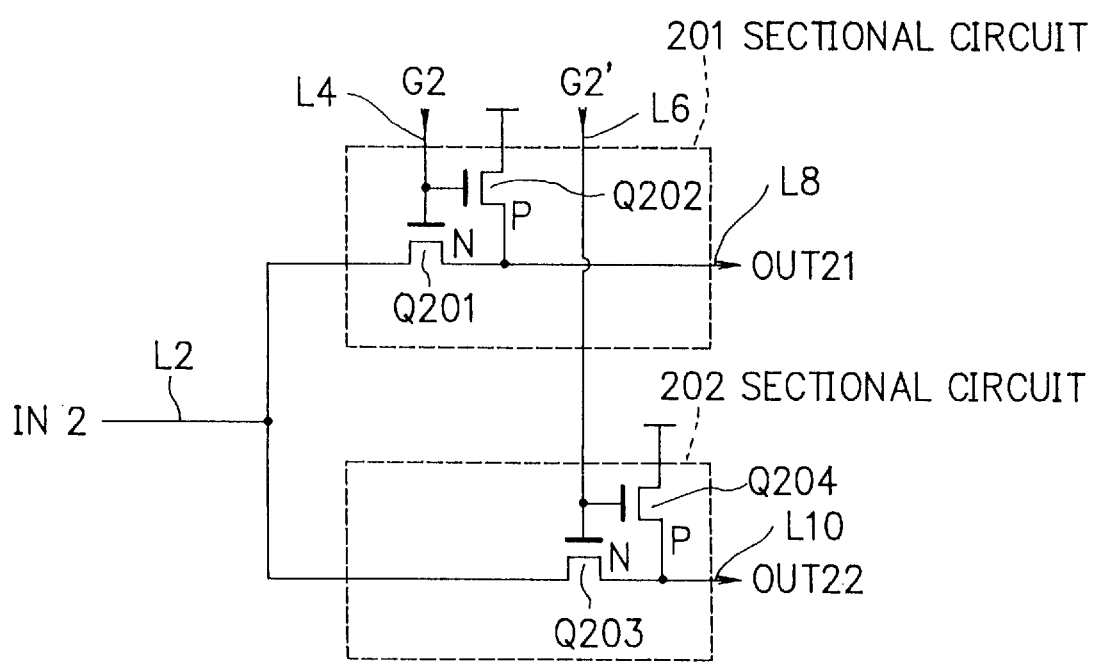
FIG. 4 is a circuit diagram showing a decoder circuit of a second embodiment of the present invention.

A description of a second embodiment of the present invention will now be given with reference to FIG. 4. FIG. 4 indicates a circuit diagram of a decoder circuit according to the second embodiment. This particular decoder circuit comprises two sectional circuits 201 and 202 which are sharing an input signal wire L2 as a common input wire. The input signal wire L2 transmits an input signal IN2. The sectional circuit 201 is composed of two transistors; a transfer-gate-circuit transistor Q201 which is an n-MOS transistor and a level-up transistor Q202 which is a p-MOS transistor. The sectional circuit 202 is composed of two transistors; a transfer-gate-circuit transistor Q203 which is an n-MOS transistor and a level-up transistor Q204 which is a p-MOS transistor.

The transfer-gate-circuit transistor Q201 has its source terminal connected to the input signal wire L2, its gate terminal connected to a TRUE address input signal wire L4 and its drain terminal connected to an output signal wire L8. The level-up transistor Q202 has its source terminal connected to a power source, its gate terminal connected to a TRUE address input signal wire L4 and its drain terminal connected to the output signal wire L8. The transfer-gate-circuit transistor Q203 has its source terminal connected to the input signal wire L2, its gate terminal connected to the BAR address input signal wire L6 and its drain terminal connected to an output signal wire L10. The level-up transistor Q204 has its source terminal connected to a power source, its gate terminal connected to the BAR address input signal wire L6 and its drain terminal connected to the output signal wire L10. Here, a TRUE address input signal G2 and a BAR address input signal G2' has an antiphase relationship.

Provided that the input signal IN2 is of level L, the TRUE address input signal G2 is of level L, and that the BAR address input signal G2' is of level H, the transfer-gate-circuit transistor Q201 and the level-up transistor Q204 become non-conductive, and the level-up transistor Q202 and the transfer-gate-circuit transistor Q203 become conductive. Consequently, the output signal OUT21 becomes of level H and the output signal OUT22 becomes of level L.

Moreover, under the condition that the input signal IN2 is of level L, the TRUE address input signal G2 is of level H and that BAR address input signal G2' is of level L, the transfer-gate-circuit transistor Q201 and the level-up transistor Q204 become conductive, and the level-up transistor Q202 and the transfer-gate-circuit transistor Q203 become non-conductive. Accordingly, both the output signal OUT21 becomes of level L and the output signal OUT22 becomes of level H.

Furthermore, when being provided that both the input signal IN2 and the TRUE address input signal G2 are of level H, and that the BAR address input signal G2' is of level L, the transfer-gate-circuit transistor Q201 and the level-up transistor Q204 become conductive, and the level-up transistor Q202 and the transfer-gate-circuit transistor Q203 become non-conductive. Thus, the output signal OUT21 and the output signal OUT22 become of level H.

In addition, when the input signal IN2 is of level H, the TRUE address input signal G2 is of level L and that BAR address input signal G2' is of level H, the transfer-gate-circuit transistor Q201 and the level-up transistor Q204 become non-conductive, and the level-up transistor Q202 and the transfer-gate-circuit transistor Q203 become conductive. Consequently, the output signal OUT21 and the output signal OUT22 become of level H.

Therefore, in case when the input signal IN2 is of level H, both the output signal OUT21 and the output signal OUT22 become of level H without depending on the levels of the TRUE address input signal G2 and the BAR address input signal G2'.

As it has been described above, when a signal of level L, i.e., a selected level, is being inputted as an input signal, the decoder circuit is to switch the levels H and L of the TRUE address input signal G2 and the BAR address input signal G2' so as to output without failing an output of level L to either the output signal wire L8 or L10 which has been selected, and to output an output of level H to the unselected output wire.

Figure 5:
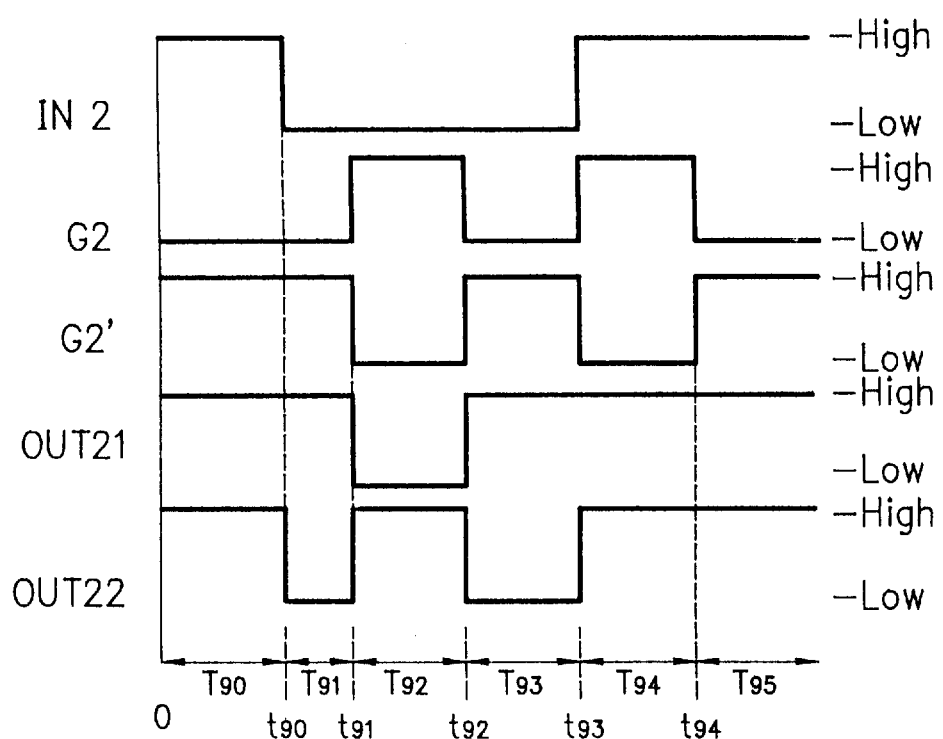
FIG. 5 is a diagram showing waveforms of the operation of the decoder circuit shown in FIG. 4.

FIG. 5 shows waveforms indicating the operation of the above-mentioned decoder circuit. The vertical axis indicates the relationship of the input signal IN2, the TRUE address input signal G2, the BAR address input signal G2', the output signal OUT21 and the output signal OUT22 in terms of levels H and L. The horizontal axis indicates the time sequence.

Figure 6:
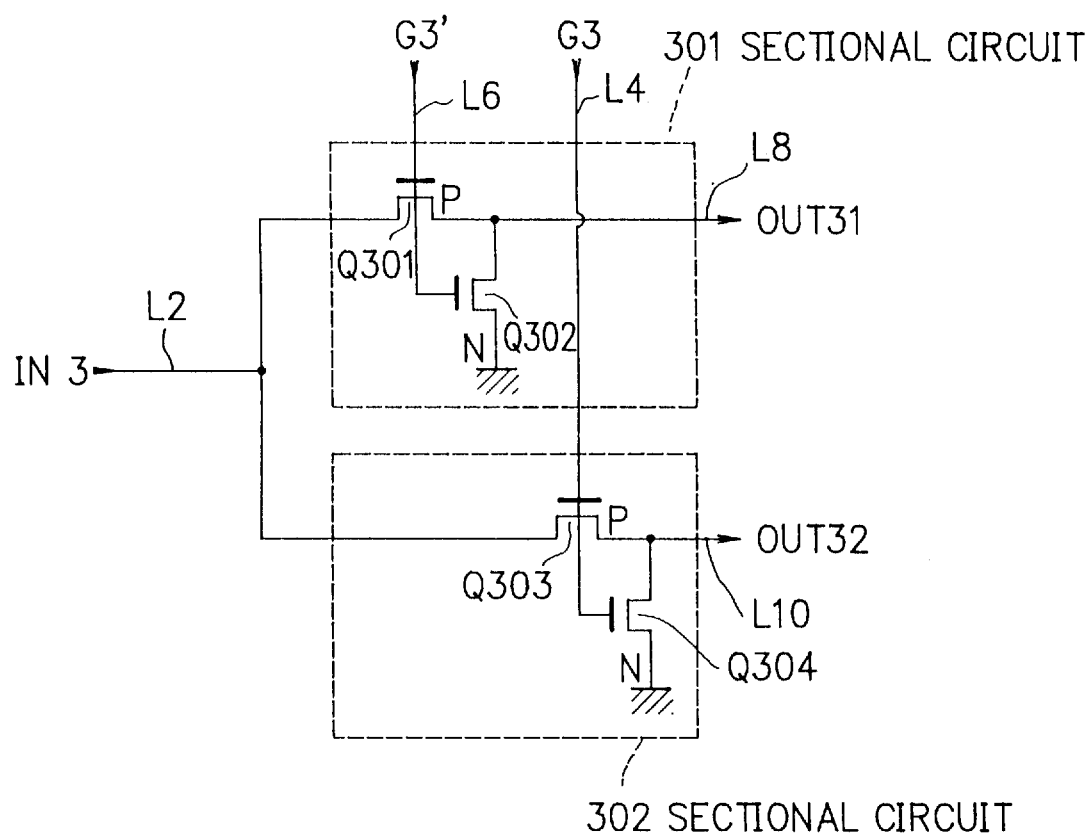
FIG. 6 is a circuit diagram showing a decoder circuit of a third embodiment of the present invention.

A description of a third embodiment of the present invention will now be given with reference to FIG. 6. FIG. 6 indicates a circuit diagram of a decoder circuit according to the third embodiment. This specific decoder circuit comprises two sectional circuits 301 and 302 which are sharing an input signal wire L2 as a common input wire. The input signal wire L2 transmits an input signal IN3. The sectional circuit 301 is composed of two transistors; a transfer-gate-circuit transistor Q301 which is a p-MOS transistor and a level-pull-down transistor Q302 which is an n-MOS transistor. The sectional circuit 302 is composed of two transistors; a transfer-gate circuit transistor Q303 which is a p-MOS transistor and a level-pull-down transistor Q304 which is an n-MOS transistor.

The transfer-gate-circuit transistor Q301 has its source terminal connected to the input signal wire L2, its gate terminal connected to a BAR address input signal wire L6 and its drain terminal connected to an output signal wire L8. The level-pull-down transistor Q302 has its source terminal grounded, its gate terminal connected to a BAR address input signal wire L6 and its drain terminal connected to the output signal wire L8. The transfer-gate-circuit transistor Q303 has its source terminal connected to the input signal wire L2, its gate terminal connected to the TRUE address input signal wire L4 and its drain terminal connected to an output signal wire L10. The level-pull-down transistor Q304 has its source terminal grounded, its gate terminal connected to the TRUE address input signal wire L4 and its drain terminal connected to the output signal wire L10. Here, a TRUE address input signal G3 and a BAR address input signal G3' has an antiphase relationship.

Provided that the input signal IN3 is of level L, the TRUE address input signal G3 is of level L, and that the BAR address input signal G3' is of level H, the transfer-gate-circuit transistor Q301 and the level-pull-down transistor Q304 become non-conductive, and the level-pull-down transistor Q302 and the transfer-gate-circuit transistor Q303 become conductive. Consequently, the output signal OUT31 and the output signal OUT32 are to become of level L.

Moreover, under the condition that the input signal IN3 is of level L, the TRUE address input signal G3 is of level H and that BAR address input signal G3' is of level L, the transfer-gate-circuit transistor Q301 and the level-pull-down transistor Q304 become conductive, and the level-pull-down transistor Q302 and the transfer-gate-circuit transistor Q303 become non-conductive. Accordingly, both the output signal OUT31 and the output signal OUT32 become of level L.

Furthermore, when being provided that both the input signal IN3 and the TRUE address input signal G3 are of level H, and that the BAR address input signal G3' is of level L, the transfer-gate-circuit transistor Q301 and the level-pull-down transistor Q304 become conductive, and the level-pull-down transistor Q302 and the transfer-gate-circuit transistor Q303 become non-conductive. Thus, the output signal OUT31 becomes of level H and the output signal OUT32 becomes of level L.

In addition, when the input signal IN3 is of level H, the TRUE address input signal G3 is of level L and that BAR address input signal G3' is of level H, the transfer-gate-circuit transistor Q301 and the level-pull-down transistor Q304 become non-conductive, and the level-pull-down transistor Q302 and the transfer-gate-circuit transistor Q303 become conductive. Consequently, the output signal OUT31 becomes of level L and the output signal OUT32 becomes of level H.

Therefore, in case when the input signal IN3 is of level L, both the output signal OUT31 and the output signal OUT32 become of level L without depending on the levels of the TRUE address input signal G3 and the BAR address input signal G3'.

As it has been described above, when a signal of level H, i.e., a selected level, is being inputted as an input signal, the decoder circuit is to switch the levels H and L of the TRUE address input signal G3 and the BAR address input signal G3' so as to output without failing an output of level H to either the output signal wire L8 or L10 which has been selected, and to output an output of level L to the unselected output wire.

The circuit operation of the present embodiment can be understood by referring to FIG. 3 and substituting IN3 for IN1, the first TRUE address input signal G3 for G1, the first BAR address input signal G3' for G1', the first output signal OUT31 for OUT11 and the second output signal OUT32 for OUT12.

Figure 7:
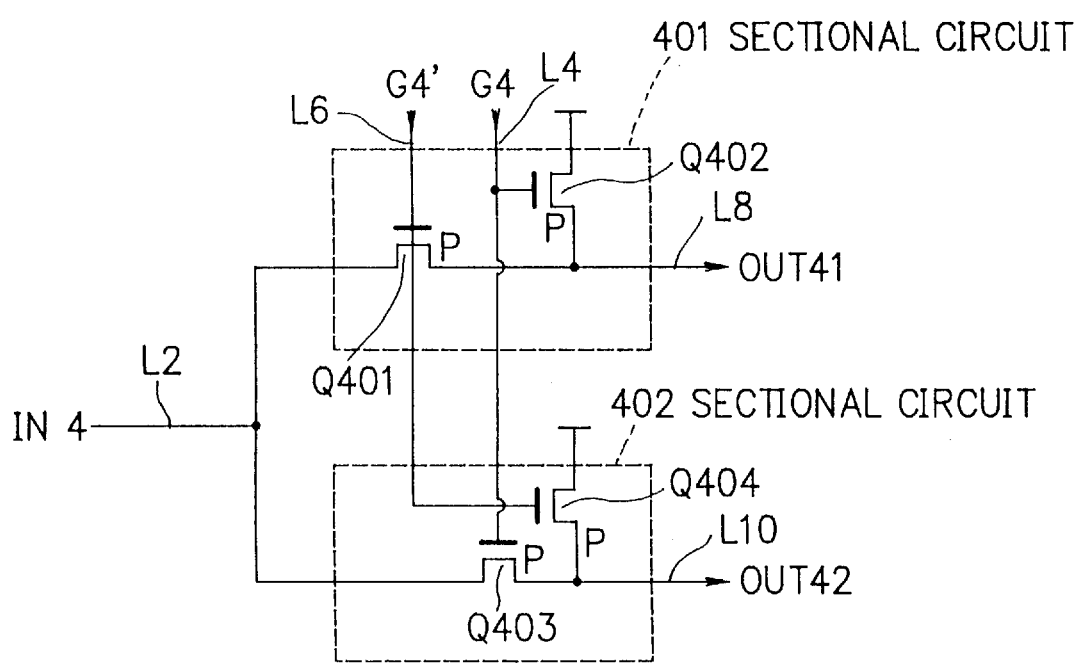
FIG. 7 is a circuit diagram showing a decoder circuit of a fourth embodiment of the present invention.

A description of a fourth embodiment of the present invention will be given with reference to FIG. 7. FIG. 7 indicates a circuit diagram of a decoder circuit according to the fourth embodiment. This particular decoder circuit comprises two sectional circuits 401 and 402 which are sharing an input signal wire L2 as a common input wire. The input signal wire L2 transmits an input signal IN4. The sectional circuit 401 is composed of two p-MOS transistors; a transfer-gate-circuit transistor Q401 and a level-up transistor Q402. The sectional circuit 402 is composed of two p-MOS transistors; a transfer-gate circuit transistor Q403 and a level-up transistor Q404.

The transfer-gate-circuit transistor Q401 has its source terminal connected to the input signal wire L2, its gate terminal connected to a BAR address input signal wire L6 and its drain terminal connected to an output signal wire L8. The level-up transistor Q402 has its source terminal connected to a power source, its gate terminal connected to a TRUE address input signal wire L4 and its drain terminal connected to the output signal wire L8. The transfer-gate-circuit transistor Q403 has its source terminal connected to the input signal wire L2, its gate terminal connected to the TRUE address input signal wire L4 and its drain terminal connected to an output signal wire L10. The level-up transistor Q404 has its source terminal connected to a power source, its gate terminal connected to the BAR address input signal wire L6 and its drain terminal connected to the output signal wire L10. Here, a TRUE address input signal G4 and a BAR address input signal G4' has an antiphase relationship.

Provided that the input signal IN4 is of level L, the TRUE address input signal G4 is of level L, and that the BAR address input signal G4' is of level H, the transfer-gate-circuit transistor Q401 and the level-up transistor Q404 become non-conductive, and the level-up transistor Q402 and the transfer-gate-circuit transistor Q403 become conductive. Consequently, the output signal OUT41 becomes of level H, and the output signal OUT42 becomes of level L.

Furthermore, under the condition that the input signal IN4 is of level L, the TRUE address input signal G4 is of level H and that BAR address input signal G4' is of level L, the transfer-gate-circuit transistor Q401 and the level-up transistor Q404 become conductive, and the level-up transistor Q402 and the transfer-gate-circuit transistor Q403 become non-conductive. Consequently, both the output signal OUT41 becomes of level L, and the output signal OUT42 becomes of level H.

In Addition, when being provided that both the input signal IN4 and the TRUE address input signal G4 are of level H, and that the BAR address input signal G4' is of level L, the transfer-gate-circuit transistor Q401 and the level-up transistor Q404 become conductive, and the level-up transistor Q402 and the transfer-gate-circuit transistor Q403 become non-conductive. Thus, the output signal OUT41 and the output signal OUT42 becomes of level H.

Moreover, when the input signal IN4 is of level H, the TRUE address input signal G4 is of level L and that BAR address input signal G4' is of level H, the transfer-gate-circuit transistor Q401 and the level-up transistor Q404 become non-conductive, and the level-up transistor Q402 and the transfer-gate-circuit transistor Q403 become conductive. Thus, the output signal OUT41 and the output signal OUT42 becomes of level H.

Accordingly, in case when the input signal IN4 is of level H, both the output signal OUT41 and the output signal OUT42 become of level H without depending on the levels of the TRUE address input signal G4 and the BAR address input signal G4'.

As it has been described above, when a signal of level L, i.e., a selected level, is being inputted as the input signal, the decoder circuit is to switch the levels H and L of the TRUE address input signal G4 and the BAR address input signal G4' so as to output without failing an output of level L to either the output signal wire L8 or L10 which has been selected, and to output an output of level H to the output wire which has not been selected.

The circuit operation of this specific decoder circuit can be understood by referring to FIG. 5 and substituting IN4 for IN2, the first TRUE address input signal G4 for G2, the first BAR address input signal G4' for G2', the first output signal OUT41 for OUT21 and the second output signal OUT42 for OUT22.

Figure 8:
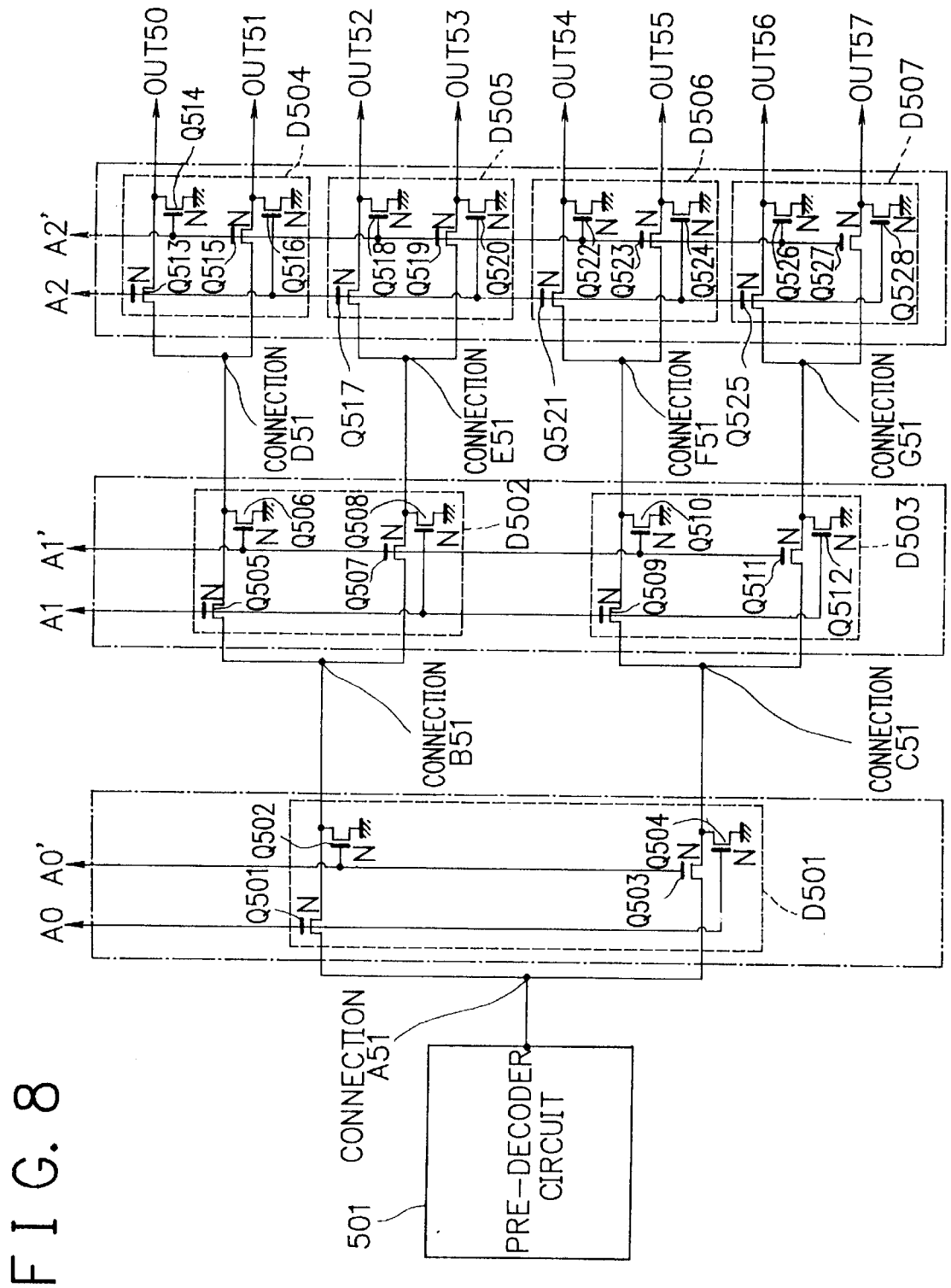
FIG. 8 is a circuit diagram showing a decoder circuit of a fifth embodiment of the present invention.

Now, there will be a description of a fifth embodiment of the present invention with reference to FIG. 8. FIG. 8 indicates a circuit diagram of a decoder circuit according to the fifth embodiment. This specific decoder circuit includes decoder circuits introduced in the first embodiment connected in series and arranged in three hierarchies in a branch-like formation. The decoder circuit of the present embodiment is capable of selecting one output signal wire out of eight output signal wires.

The decoder circuit of the fifth embodiment comprises a decoder circuit set 550 of the first hierarchy, a decode circuit set 552 of the second hierarchy and a decoder circuit set 554 of the third hierarchy. The decoder circuit set 550 of the first hierarchy includes a decoder circuit D501 relating to the first embodiment. The decoder circuit set 552 of the second hierarchy includes decoder circuits D502 and D503 also relating to the decoder circuit of the first embodiment. The decoder circuit set 554 of the third hierarchy includes decoder circuits D504, D505, D506 and D507 of the first embodiment. In each hierarchy, the decoder circuits positioned within the hierarchy are sharing a common TRUE address input signal wire and a BAR address input signal wire.

An input signal wire L50 of the decoder circuit set of the first hierarchy is connected to the output wire of a pre-decoder circuit 501. The decoder circuit set of the second hierarchy has two of its input signal wires connected, without overlapping, to two of the output signal wires of the first decoder circuit set of the first hierarchy. The decoder circuit set of the third hierarchy has four of its input signal wires connected, without overlapping, to four of the output signal wires of the decoder circuit set of the second hierarchy.

Moreover, eight output signal wires L52 to L66 of the decoder circuit set belonging to the third hierarchy are the output signal wires of the decoder circuit of the fifth embodiment.

Here, one example of circuit operation of this particular decoder circuit is to be given. Provided that an input signal of level H is inputted to the input signal wire L50, a first TRUE address input signal A0 is of level H, a first BAR address input signal A0' is of level L, a second TRUE address input signal A1 is of level H, a second BAR address input signal A1' is of level L, a third TRUE address input signal A2 is of level H and that a third BAR input address input signal A2' is of level L, the output signal OUT50 is to become of level H and the remaining seven output signals OUT51 to OUT57 are to become of level L.

Therefore, under the condition in which the decoder circuit is inputted an input signal of level H, the decoder circuit is to change the applying levels of the first to third TRUE address input signals and the first to third BAR input address signals, so as to output one output signal out of eight output signals OUT50 to OUT58 with level H and the remaining seven output signals with level L.

Figure 9:
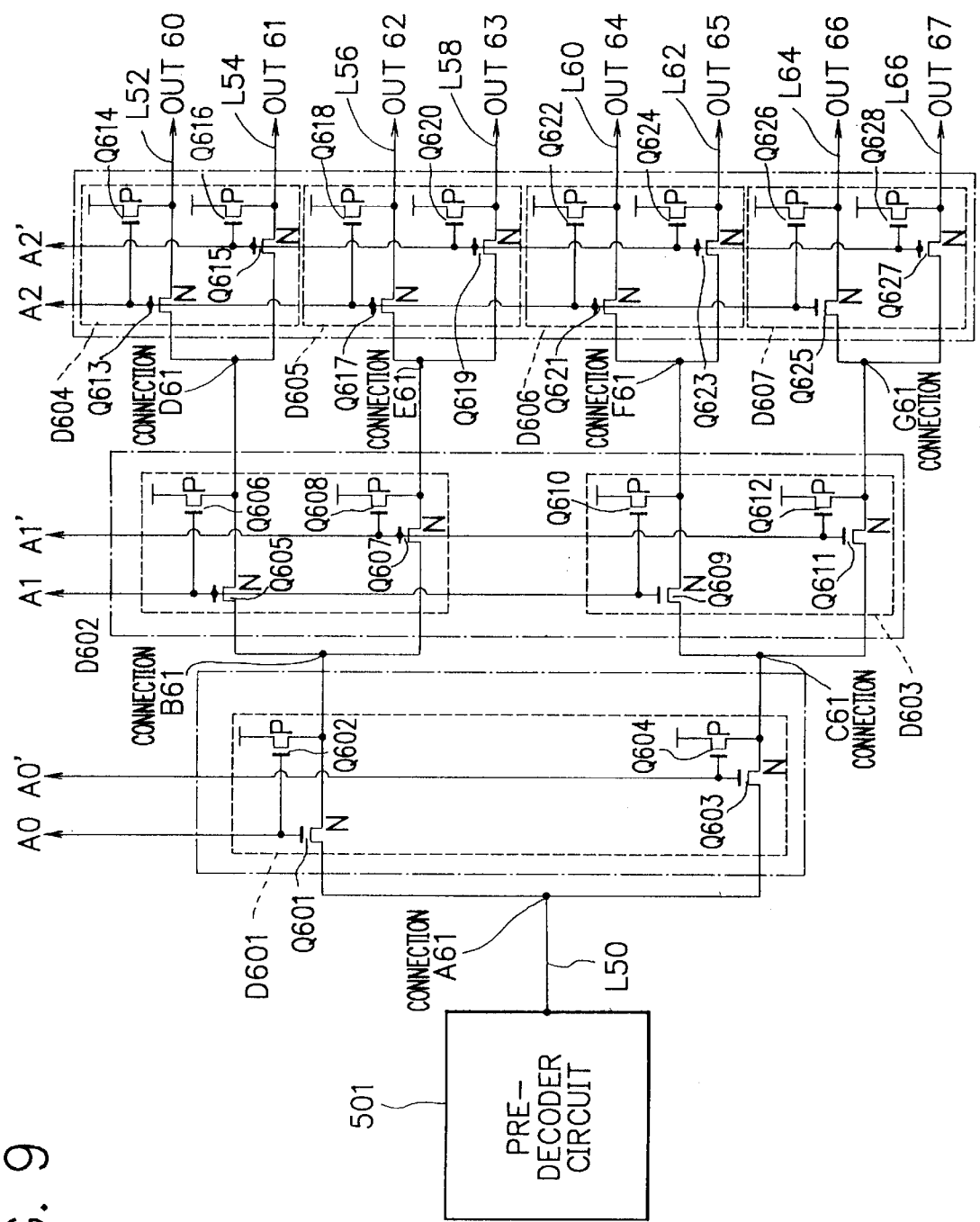
FIG. 9 is a circuit diagram showing a decoder circuit of a sixth embodiment of the present invention.
Figure 10:
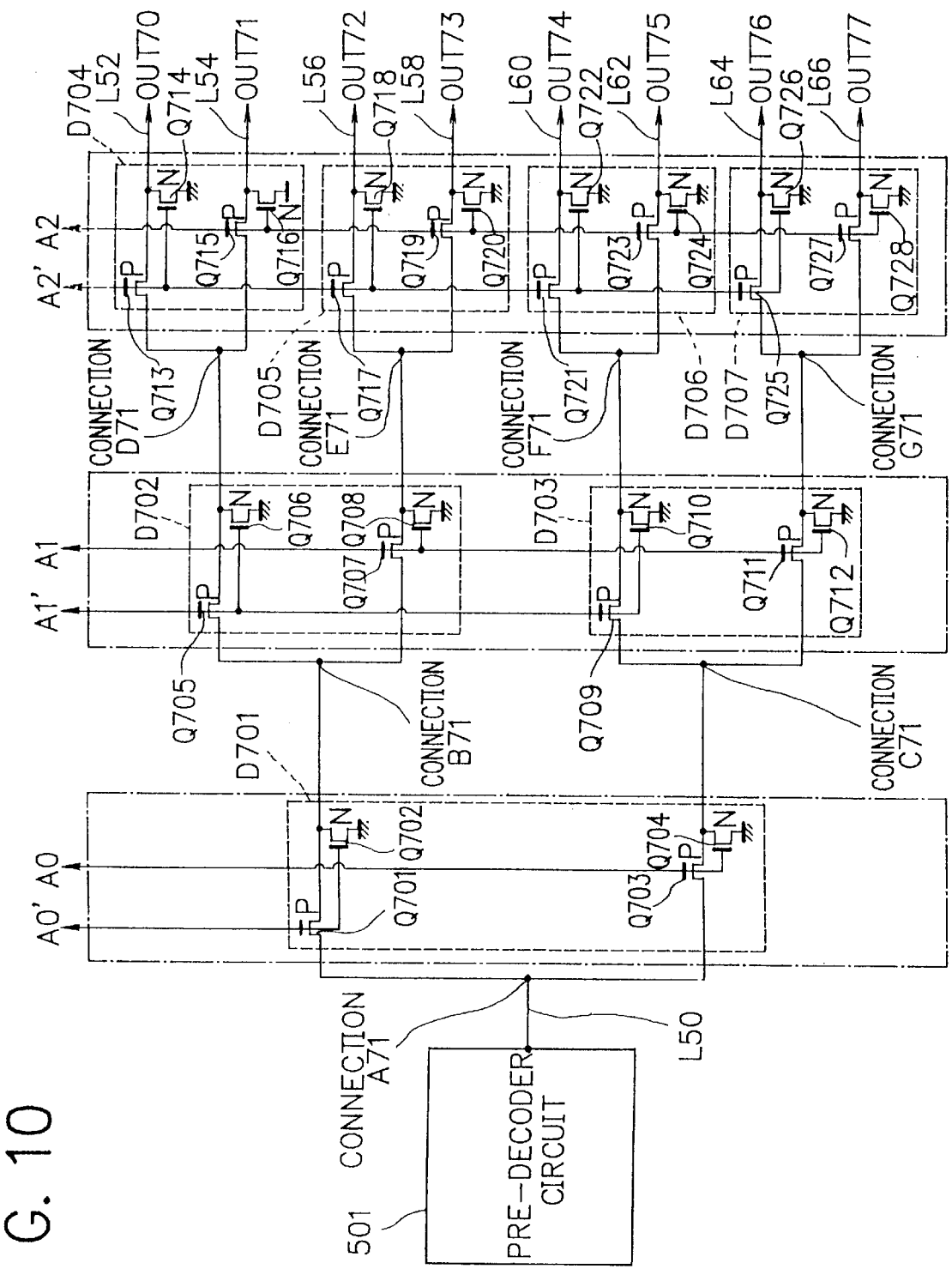
FIG. 10 is a circuit diagram showing a decoder circuit of a seventh embodiment of the present invention.
Figure 11:
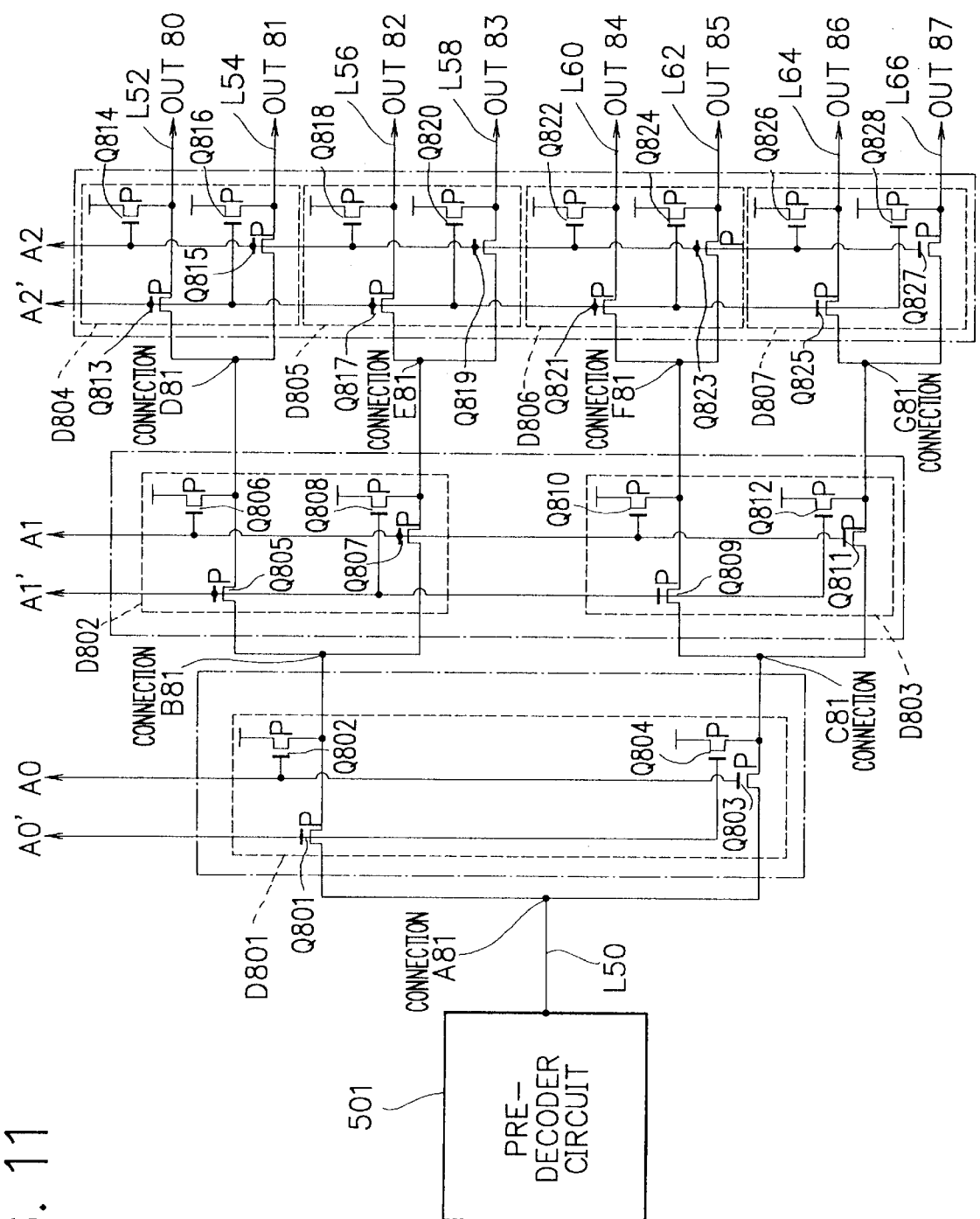
FIG. 11 is a circuit diagram showing a decoder circuit of an eighth embodiment of the present invention.

Next, there will be descriptions of a sixth, seventh, and eighth embodiments of the present invention with reference to the accompaning drawings. FIG. 9, FIG. 10 and FIG. 11 are respectively showing the decoder circuits of the sixth, seventh and the eighth embodiments of the present invention. In each of the decoder circuits, decoder circuits described in the second, third and fourth embodiments are applied to decoder circuits D501 to D507. Thus, the decoder circuits of the sixth, seventh and eighth embodiments are capable of selecting one output signal out of eight output signals. In case of the seventh embodiment, the decoder circuit outputs a similar output signal to that of the above fifth embodiment. However, in cases of the sixth and eighth embodiments, being inputted an input signal of level L, the decoder circuit is to output one output signal with level L and the remaining seven output signals with level H.

Although the above fifth to eighth embodiments similarly have a three-hierarchic decoder circuit in which three sets of decoder circuits are connected, the number of the hierarchies can be replaced with another voluntary natural number. For example, when one of the decoder circuits of the fifth to eighth embodiments is a four-hierarchic decoder circuit in which four sets of decoder circuits are connected, it means that this decoder circuit is capable of choosing one output signal wire out of 16 output signal wires.

Moreover, the decoder circuits of the above-mentioned fifth to eighth embodiments and any decoder circuit comprising an optional number of circuit assembly including a plurality of decoder circuits indicated in the first to fourth embodiments have a total of $2^{n-1}$ decoder circuits in the hierarchy number n. However, this number $2^{n-1}$ for the decoder circuits can be changed.

Furthermore, the decoder circuits of the above fifth to eighth embodiments are to comprise plural decoder circuits belonging to any one of the four types of decoder circuit indicated in the first to fourth embodiments. For instance, as to the decoder circuit of the fifth embodiment, an optional number of decoder circuits corresponding to those of the first embodiment can be used in stead of the decoder circuits of the third embodiment. On the contrary, as to the decoder circuit of the seventh embodiment, an optional number of decoder circuits corresponding to those of the third embodiment can be employed in stead of the decoder circuits of the first embodiment. Moreover, as to the decoder circuit of the sixth embodiment, an optional number of decoder circuits corresponding to those of the fourth embodiment can be used in stead of the decoder circuits of the second embodiment. On the other hand, as to the decoder circuit of the eighth embodiment, an optional number of decoder circuits corresponding to those of the second embodiment can be employed in stead of the decoder circuits of the third embodiment. Likewise, the same goes for the decoder circuits other than the one having groups of decoder circuits arranged in three hierarchies.

Figure 12:
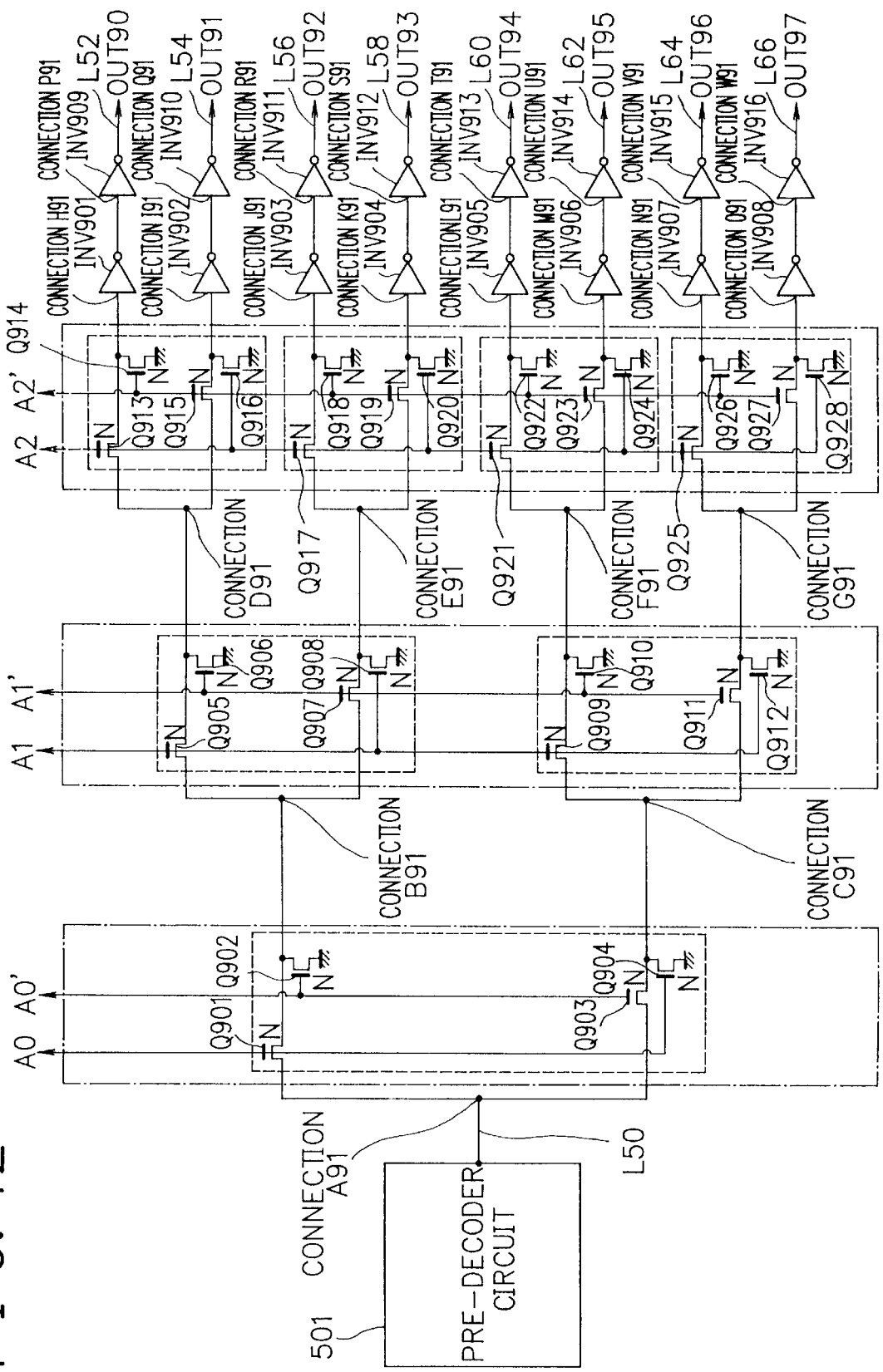
FIG. 12 is a circuit diagram showing a decoder circuit of a ninth embodiment of the present invention.

Next, there will be a description of a ninth embodiment of the present invention with reference to the accompanying drawing. FIG. 12 is a circuit diagram of a decoder circuit of the ninth embodiment. This decoder circuit essentially has the same configuration as that corresponding to the fifth embodiment, except that this particular circuit additionally has inverters connected to the output signal wires in two stages. The decoder circuit of the ninth embodiment is to be used when the output load capacitance of the decoder circuit is large.

Each of the output wires L52 to L66 of the decoder circuit of the present embodiment outputs the same level of output signal as that of the decoder circuit of the fifth embodiment.

Although it has been explained in the above ninth embodiment that two inverter circuits are connected to each output wire of the decoder circuit of the fifth embodiment, it is obvious that this applies to the other decoder circuits corresponding to those of the sixth to eighth embodiments. That is to say, any decoder circuit of the sixth to eighth embodiments can have two inverters connected to each of its output wires. Moreover, it is also evident that a decoder circuit comprising an optional number of decoder circuits corresponding to any one of the four types of decoder circuit described in the first to fourth embodiments can have two inverter circuits connected to each of its output wires. Not to mention, it is obvious that the number of inverters do not have to be two as in the above example, but can be set to a voluntary number.

Basing on the above descriptions, the number of transistors constructing the decoder circuit of the present invention can be given by the following formula.

(number of transistors of decoder circuit of the present invention )= ③

Here, the number n indicates the number of the address input signal wires. The decoder circuit of the present invention can operate with lesser transistors as compared to the conventional decoder circuit. The number of transistors can be reduced by the number given by the following formula.

(number of reduced transistors)= ④

FIG. 13 is now referred to in giving specific examples of numbers for the transistor elements of both the conventional decoder circuits and the decoder circuits of the present invention, and numbers for the reduced transistor elements in comparing the decoder circuits of the conventional type with the decoder circuits of the present invention.

FIG. 13 is a chart comparing conventional decoder circuits and the decoder circuits of the present invention in terms of numbers of their transistor elements which also shows resultants of comparison as numbers of reduced transistor elements. In the indicated cases, the numbers of address signal input wires are set to two to six. In addition, the bracketed percentage shown in a column for the reduced number of transistor elements indicates 100× (number of transistor elements of decoder circuit of the present invention)/(number of transistor elements of conventional decoder circuit). As it is clearly shown in this chart, the number of transistor elements for the present invention can be reduced by more than half the number of transistor elements for the conventional decoder circuit. As a result, the area of the decoder circuit can be reduced by half. Consequently, the portion occupied by the decoder circuit within the semiconductor memory device can be minimized.

While preferred embodiments of the invention have been described using specific terms, such description is for illustrative purposes only, and it is to be understood that changes and variations may be made without departing from the spirit or the scope of the following claims.

What is claimed is:

1. A decoder circuit for decoding signals comprising:
   an input signal wire for transmitting an input signal;
   a first output signal wire for transmitting a first output signal;
   a second output signal wire for transmitting a second output signal;
   a first address signal wire for transmitting a first TRUE address input signal;
   a second address signal wire for transmitting a second BAR address input signal which is the antiphase of the first TRUE address signal;
   a first n-MOS transistor having its source terminal connected to the input signal wire, its gate terminal connected to the first address signal wire and its drain terminal connected to the first output signal wire;
   a second n-MOS transistor having its source terminal connected to a power source on the ground level, its gate terminal connected to the second address signal wire and its drain terminal connected to the first output signal wire;
   a third n-MOS transistor having its source terminal connected to the input signal wire, its gate terminal connected to the second address signal wire and its drain terminal connected to the second output signal wire; and
   a fourth n-MOS transistor having its source terminal connected to a power source on the ground level, its gate terminal connected to the first address signal wire and its drain terminal connected to the second output signal wire.

2. A decoder circuit according to claim 1, wherein:
   the first and the third n-MOS transistors are transfer-gate-circuit transistors; and
   the second and the fourth n-MOS transistors are level-pull-down transistors.

3. A decoder circuit for decoding signals comprising:
   an input signal wire for transmitting an input signal;
   a first output signal wire for transmitting a first output signal;
   a second output signal wire for transmitting a second output signal;
   a first address signal wire for transmitting a first TRUE address input signal;
   a second address signal wire for transmitting a second BAR address input signal which is the antiphase of the first TRUE address signal;
   a first n-MOS transistor having its source terminal connected to the input signal wire, its gate terminal connected to the first address signal wire and its drain terminal connected to the first output signal wire;
   a first p-MOS transistor having its source terminal connected to a power source, its gate terminal connected to the first address signal wire and its drain terminal connected to the first output signal wire;
   a third n-MOS transistor having its source terminal connected to the input signal wire, its gate terminal connected to the second address signal wire and its drain terminal connected to the second output signal wire; and a second p-MOS transistor having its source terminal connected to a power source, its gate terminal connected to the second address signal wire and its drain terminal connected to the second output signal wire.

4. A decoder circuit according to claim 3, wherein:

the first and the third n-MOS transistors are transfer-gate-circuit transistors; and the first and the second p-MOS transistors are level-up transistors.

5. A decoder circuit for decoding signals comprising:

an input signal wire for transmitting an input signal;

a first output signal wire for transmitting a first output signal;

a second output signal wire for transmitting a second output signal;

a first address signal wire for transmitting a first TRUE address input signal;

a second address signal wire for transmitting a second BAR address input signal which is the antiphase of the first TRUE address signal;

a third p-MOS transistor having its source terminal connected to the input signal wire, its gate terminal connected to the first address signal wire and its drain terminal connected to the first output signal wire;

a second n-MOS transistor having its source terminal connected to a power source on the ground level, its gate terminal connected to the first address signal wire and its drain terminal connected to the first output signal wire;

a fourth p-MOS transistor having its source terminal connected to the input signal wire, its gate terminal connected to the second address signal wire and its drain terminal connected to the second output signal wire; and a fourth n-MOS transistor having its source terminal connected to a power source on the ground level, its gate terminal connected to the second address signal wire and its drain terminal connected to the second output signal wire.

6. A decoder circuit according to claim 5, wherein:

the third and the fourth p-MOS transistors are transfer-gate-circuit transistors; and the second and the fourth n-MOS transistors are level-pull-down transistors.

7. A decoder circuit for decoding signals comprising:

an input signal wire for transmitting an input signal;

a first output signal wire for transmitting a first output signal;

a second output signal wire for transmitting a second output signal;

a first address signal wire for transmitting a first TRUE address input signal;

a second address signal wire for transmitting a second BAR address input signal which is the antiphase of the first TRUE address signal;

a third p-MOS transistor having its source terminal connected to the input signal wire, its gate terminal connected to the first address signal wire and its drain terminal connected to the first output signal wire;

a fourth p-MOS transistor having its source terminal connected to the input signal wire, its gate terminal connected to the second address signal wire and its drain terminal connected to the second output signal wire;

a fifth p-MOS transistor having its source terminal connected to a power source, its gate terminal connected to the second address signal wire and its drain terminal connected to the first output signal wire; and a sixth p-MOS transistor having its source terminal connected to a power source, its gate terminal connected to the first address signal wire and its drain terminal connected to the second output signal wire.

8. A decoder circuit according to claim 7, wherein:

the third and the fourth p-MOS transistors are transfer-gate-circuit transistors; and the fifth and the sixth p-MOS transistors are level-up transistors.

9. A decoder circuit for decoding signals comprising:

hierarchically constructed decoder circuit assemblies each of which including a plurality of decoder circuits corresponding to the decoder circuit according to claim 1 among which the first address input wire and the second input address wire are shared, where each input signal wire of a decoder circuit assembly of number n, where n is a natural number equal to or over two, is connected without overlapping to either the first or the second output signal wire of a decoder circuit assembly of number n−1.

10. A decoder circuit according to claim 9, wherein:

the decoder circuit assembly of number n includes a total of $2^{n-1}$ decoder circuits corresponding to the decoder circuit indicated in claim 1; and a total of $2^{n-1}$ input signal wires of the decoder circuit assembly of number n are connected without overlapping to a total of $2^{n-1}$ the first or the second output signal wires.

11. A decoder circuit according to claim 10, wherein each of the output signal wires of the decoder circuit assembly belonging to the last hierarchy is connected to a certain number of inverters in series.

12. A decoder circuit according to claim 9, wherein each of the output signal wires of the decoder circuit assembly belonging to the last hierarchy is connected to a certain number of inverters in series.

* * * * *